United States Patent [19]

Frey

[11] Patent Number: 4,560,947
[45] Date of Patent: Dec. 24, 1985

[54] MONOLITHIC VOLTAGE CONTROLLED ELEMENT

[76] Inventor: Douglas R. Frey, 1211 Stafore Dr., Bethlehem, Pa. 18017

[21] Appl. No.: 648,889

[22] Filed: Sep. 10, 1984

Related U.S. Application Data

[63] Continuation-in-part of Ser. No. 267,691, May 27, 1981, Pat. No. 4,471,320.

[51] Int. Cl.[4] .......................... H03F 3/45; H03G 3/10
[52] U.S. Cl. .................................. 330/254; 330/261; 330/285; 330/257
[58] Field of Search ............... 330/252, 254, 259, 260, 330/261, 276–279, 285

[56] References Cited

U.S. PATENT DOCUMENTS 3,908,172 9/1975 Aschermann et al. .............. 330/254

Primary Examiner—James B. Mullins
Assistant Examiner—G. Wan

[57] ABSTRACT

A monolithically fabricated voltage controlled element includes first and second pairs of transistors where bases of two of the transistors are connected to a reference voltage and bases of the remaining two transistors are connected to a control signal, emitters of transistors of respective pairs are connected together, where differences in collector currents between transistors of said pairs define output signals from said element, and includes circuitry providing variable compensation, user-selectable class A or class AB operation and distortion correction.

20 Claims, 6 Drawing Figures

MONOLITHIC VOLTAGE CONTROLLED ELEMENT

CROSS REFERENCE TO RELATED APPLICATION

The patent application is a continuation-in-part of patent application Ser. No. 267,691, filed May 27, 1981, which issued as U.S. Pat. No. 4,471,320 on Sept. 11, 1984.

BACKGROUND OF THE INVENTION

1. Field of the Invention

This invention relates to monolithic voltage controlled elements especially useful as voltage controlled amplifiers and/or potentiometers.

2. Description of the Prior Art

Multiplier circuits, amplifier circuits and attenuator circuits are disclosed in U.S. Pat. Nos. 3,714,462; 4,155,047; 4,157,512; 4,163,197; 4,169,247, 4,177,432; 4,180,780 and 4,187,472. Such circuits have also been disclosed in the article "Designers' Guide to: Basic AGC Amplifier Design" appearing in the Jan. 20, 1974 issue of *Electronic Design News*, the article "Voltage-Controlled Amplifier Covers 70 db Range" appearing in the Mar. 5, 1975 issue of *Electronic Design News*, the article "Linear Voltage-Controlled Attenuator-DC to 20 kHz" appearing in the March 1976 issue of *Electronic Engineering*, the article "A Monolithic Voltage-Controlled Amplifier Employing Log-Antilog Techniques" appearing in the March 1976 issue of the *Journal of the Audio Engineering Society*, the article "A Multiplex Remote-Control System" appearing in the September 1977 issue of the *Journal of the Audio Engineering Society*, the article "Current-Compensated Op Amp Improves OTA Linearity" appearing in the Mar. 17, 1977 issue of *Electronics*, in the paper entitled "Techniques for the Realization and Application of Voltage Controlled Amplifiers and Attenuators" presented at the Audio Engineering Society Convention in May of 1978 at Los Angeles, Calif. and in the paper entitled "The Design and Integration of a High Performance Voltage Controlled Attenuator" presented at the Audio Engineering Society Convention in November, 1979 in New York City.

Patents disclosing use of feedback to improve circuit performance include U.S. Pat. Nos. 4,163,948; 4,197,426 and 4,201,888. Use of feedback to improve circuit performance is also disclosed in the paper "Multipurpose Hardware for Digital Coding of Audio Signals" presented at the National Telecommunications Conference held December, 1977 in Los Angeles and in the paper "Electronically Tunable RC Sinusoidal Oscillators" published in the June, 1975 *IEEE Transactions on Instrumentation and Measurement*.

Also of interest is the product bulletin entitled "Engineering Data-Allison EGC-101 and Related Circuits" distributed by Valley People, Incorporated, P.O. Box 40306, 2028 Erica Place, Nashville, Tenn., 37204, disclosing substantially the circuits disclosed in the '462 patent.

The U.S. Pat. Nos. '047 and '462 patents are believed of greatest relevance to this invention.

The U.S. Pat. No. '047 circuit is a multiplier circuit accepting as input a differential input current and developing a differential output voltage proportional to the input current. Gain is determined by a control voltage establishing a bias on the transistor pairs, causing emitter current to split predictably. Various support circuitry may be used to convert a single input signal to a differential input current and to convert the differential outputs to a single signal.

The U.S. Pat. No. '047 circuit unfortunately requires extreme matching between left and right components. Without close matching, direct current appears in the output with the direct current component being dependent on the control voltage, i.e. control voltage feedthrough results. Moreover, thermal drifts can cause circuit output to drift unacceptably. A further disadvantage of the U.S. Pat. No. '047 circuit is the lack of log conformity in the gain control. This lack of conformity is particularly apparent near maximum gain. Still further, the maximum gain available with the central portion of the U.S. Pat. No. '047 circuit is unity. Gain can be introduced to the output stage, but, unfortunately, this leads to degradation in the signal-to-noise ratio.

An additional disadvantage of circuits of the U.S. Pat. No. '047 type is caused by noise of the central transistors; output noise may be sufficient that the equivalent input noise is unacceptably high, making such circuits inoperable with small signals.

OBJECTS OF THE INVENTION

This invention seeks to provide a high quality monolithic voltage controlled element, improved over the core circuit disclosed in U.S. Pat. No. '047, useful as a voltage controlled amplifier and as a voltage controlled potentiometer with differential pairs of transistors having driver circuitry providing variable compensation, selectable class A or class AB operation and automatic distortion compensation.

SUMMARY OF THE INVENTION

In one aspect, this invention provides a monolithic voltage controlled element which includes first and second differential pairs of transistors, each transistor having a base, an emitter and a collector, where the second transistors of each pair may have their bases connected together and to a reference voltage while bases of first transistors of the pairs are connected to a control signal, emitters of the transistors of the respective pairs are connected together with respective paired emitters being connected to respective current production means which draw respective currents from the respective connected emitters differing by an amount proportional to a control signal input to the element, the difference in collector currents of the first transistors of the pairs defining a first output signal and the difference in collector currents of the second transistors of the pairs defining a second output signal and including means for producing a signal input to the current production means in response to the combination of at least one of said output signals and an arbitrary input.

In another aspect of the invention, bases of first transistors of the pairs are connected to a control signal, bases of second transistors of the pairs are connected to a reference voltage, collectors of first transistors of the respective pairs are connected with collectors of second transistors of the remaining pairs, emitters of transistors of the second pair being connected together and to a current source, emitters of transistors of the first pair being connected together and to a reference supply voltage, with current from connected collectors of said first transistor of said second pair and said second transistor of said first pair defining a first output signal and current from connected collectors of said first transistor of said first pair and said second transistor of said second pair defining a second output signal and including means for producing signal input to the current production means in response to combination of at least one of said output signals and an arbitrary input.

The voltage controlled element is configured as a multiplier circuit and can be used as a voltage controlled amplifier or potentiometer. The circuit may be implemented as all NPN transistors, all PNP transistors or as a mixture of NPN and PNP transistors. The circuit is preferably fabricated monolithically.

DESCRIPTION OF THE PREFERRED EMBODIMENTS

Figure 1:
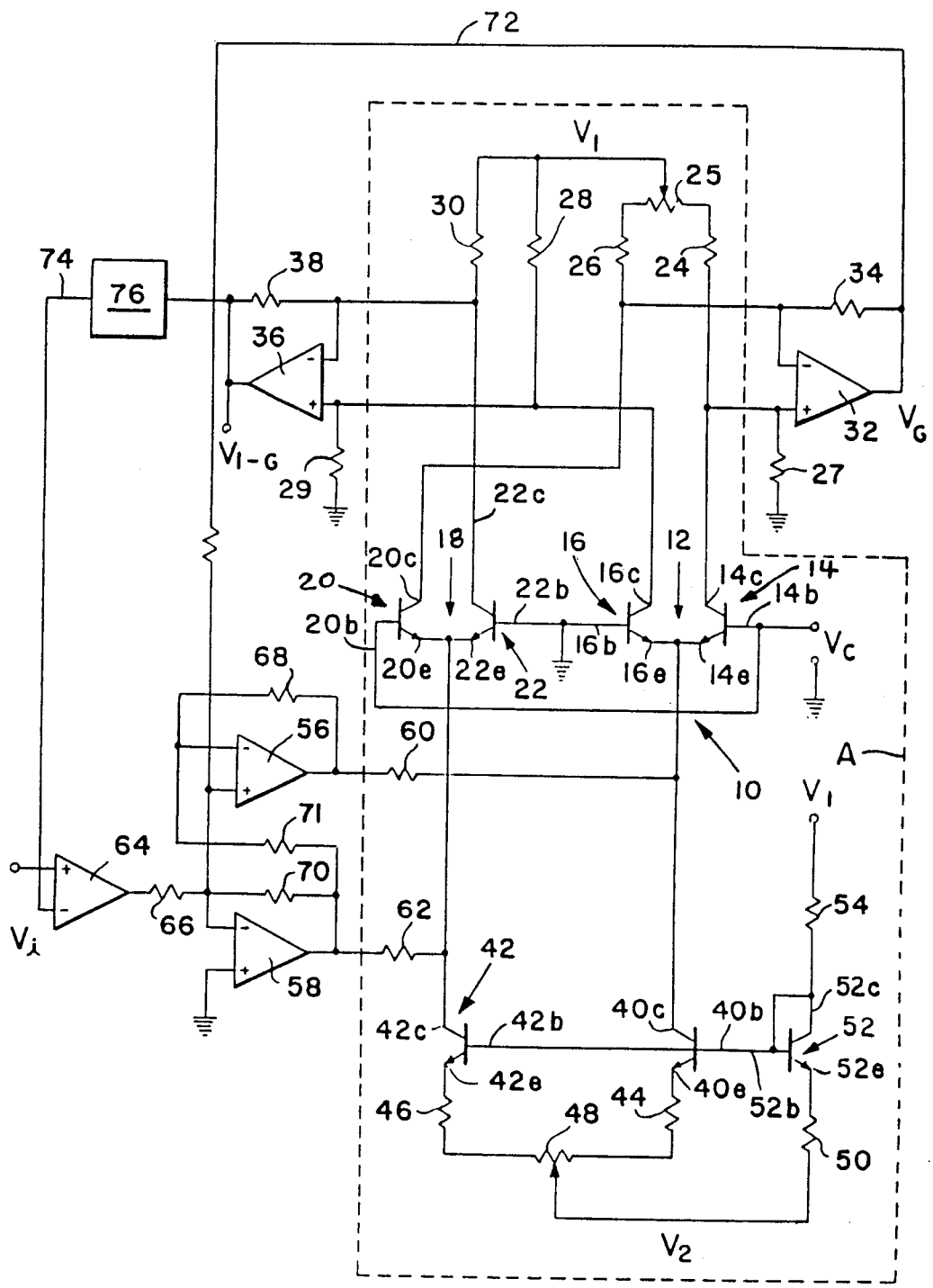
FIG. 1 is a schematic representation of a circuit embodying the invention, implemented with NPN core transistors.

Referring to FIG. 1, a voltage controlled multiplier circuit to which this invention relates is designated generally 10 and is within rectangle A. Circuit 10 includes a first pair 12 of NPN-type transistors with the first transistor of pair 12 denoted 14 and the second transistor of pair 12 denoted 16. A second pair of NPN-type transistors is denoted 18 and includes a first transistor 20 and a second transistor 22.

Transistors 14, 16, 20, 22 each have a base, an emitter and a collector indicated by letters b, e and c respectively; accordingly, 14e denotes the emitter of transistor 14. Second transistors 16, 22 have their respective bases 16b, 22b connected together and to ground. Emitters 14e, 16e of transistors 14, 16 of first pair 12 are connected together; similarly, emitters 20e, 22e of transistors 20, 22 of second pair 18 are connected. Bases 14b, 20b are connected commonly to a control voltage $V_c$; gain of the circuit element is proportional to control voltage $V_c$.

The control voltage $V_c$ represents a difference in voltage potential between the two pairs of connected bases. Specifically, bases of transistors 16, 22 need not be grounded; bases of transistors 16, 22 and of transistors 14, 20 must, however, be maintained at different voltage potentials. $V_c$ is obtained by applying a voltage difference between connected bases 16b, 22b and 14b, 20b. Any suitable means may be used to apply the required voltage difference.

Resistors 28, 30 are connected between collectors 16c, 22c of second transistor 16, 22 and a reference voltage $V_1$. Resistors 24, 26 are connected between collectors 14c, 20c of first transistors 14, 20 and a trim pot 25 having a tap connected to reference voltage $V_1$. During operation the difference in currents from collectors 14c, 20c defines a first intermediate output while the difference in currents from collectors 16c, 22c defines a second intermediate output. The sum of the intermediate outputs is a constant times the input to the voltage controlled multiplier within rectangle A.

A first differential amplifier 32 in combination with associated resistors 24, 25, 26, 27, 34 converts the first intermediate output from collectors 14c, 20c to a first output voltage $V_G$ proportional to gain G of the circuit shown in FIG. 1. The product of gain G and the input voltage $V_i$ defines the first output voltage $V_G$. Of course, $V_G$ is also affected by the values chosen for the various feedback elements, resistors and the like. Resistor 27 connects the positive input terminal of first differential amplifier 32 to ground while resistor 34 connects the negative input terminal of first differential amplifier 32 to output thereof.

A second differential amplifier 36 in combination with associated resistors 28, 29, 30, 38 converts the second intermediate output from collectors 16c, 22c to a second output voltage $V_{1-G}$ proportional to a constant minus the gain G. Resistor 29 connects the positive input terminal of second differential amplifier 36 to ground while resistor 38 connects the negative input terminal of second differential amplifier 36 to the output thereof.

As used herein, gain G of the multiplier circuit enclosed within dash line A is the ratio of the emitter current at emitter 14e of first transistor 14 of first pair 12 to the sum of the currents from emitters 14e, 16e of first and second transistors 14, 16 of first pair 12. This current ratio defining gain G is the same for each of the pairs 12, 18 of transistors, i.e. ratio of current from emitter 14e to the sum of currents from emitters 14e, 16e is the same as the ratio of current from emitter 20e to the sum of currents from emitters 20e, 22e.

Transistors 40, 42 have their respective collectors 40c, 42c connected respectively to connected emitters 14e, 16e and 20e, 22e of first and second pairs of transistors 12, 18; consequently transistors 40, 42 act as current sources respectively drawing currents from respective connected emitters 14e, 16e and 20e, 22e. Emitters 40e, 42e are connected via respective resistors 44, 46 to a variable resistor 48 having its tap connected to reference voltage $V_2$. Variable resistor 48 is useful in balancing the circuit under certain optional feedback conditions determined by the character of feedback element 76. Resistor 50 connects reference voltage $V_2$ to an emitter 52e of seventh transistor 52; the base and collector of seventh transistor 52 and the bases of transistors 40, 42 are connected via resistor 54 to reference voltage $V_1$.

Current source transistors 40, 42 provided equal DC bias currents for transistor pairs 12, 18. This causes currents to flow through respective connected emitters 14e, 16e and 20e, 22e differing by an amount proportional to the voltages applied by third and fourth differential amplifiers 56, 58 respectively. Amplifiers 56, 58 are connected to respective connected emitters 14e, 16e and 20e, 22e via resistors 60, 62 respectively.

A fifth amplifier 64 receives input voltage $V_i$ and supplies as output a signal input to third and fourth amplifiers 56, 58 via resistor 66. Resistors 68, 70 respectively provide feedback of the output from amplifers 56, 58 to the negative input terminals thereto. Output of fourth amplifier 58 is provided via resistor 71 as input to third amplifier 56.

Line 72 provides output of first amplifier 32 as input to respective positive and negative terminals of third and fourth amplifiers 56, 58. Similarly, line 74 provides output of second amplifier 36 as input to the negative terminal of fifth amplifier 64, with a feedback connection 76 provided therebetween. Feedback connection 76 may be an active or passive network of components, for example a voltage divider.

During operation, the combination of third and fourth amplifiers 56, 58 acting with seventh transistor 52 on fifth and sixth transistors 40, 42 causes differential input current to flow from connected emitters 14e, 16e and 20e, 22e with the circuit developing respective differential output currents from collectors 14c and 20c and from collectors 16c and 22c which are proportional to the differential input current. Respective gains are determined by the control voltage $V_c$ applied to bases 14b, 20b of transistors 14, 20. Control voltage $V_c$ establishes bias on transistor pairs 12, 18, causing emitter current to split predictably.

Adding line 72 provides improved log conformity and causes equivalent input noise to drop as circuit gain becomes more and more positive as controlled by magnitude of $V_c$.

When line 72 is included, gain of the circuitry associated with amplifiers 32, 56, 58 may be chosen so that output of amplifier 36 is always a constant times the voltage at the output of amplifier 64.

When line 74 is added, providing a second feedback path having gain determined by feedback connection 76, drift and mismatch characteristics of amplifiers 56, 58, transistors 40, 42, 52 and the associated resistors are greatly reduced, effectively confining mismatch and drift to the first stage of the circuit, i.e. amplifier 64, reducing overall thermal drift. Inclusion of line 74 resuIts in log conformity of the circuit being unaffected by inaccuracies in feedback gains and reduces control voltage feedthrough. To balance the circuit for minimum DC shift in the output as control voltage $V_c$ varies, the tap on variable resistor 25 is adjusted; negative feedback provided by line 74 and feedback connection 76 overcomes other inaccuracies.

$V_1$ and $V_2$ are supply voltages. $V_1$ and $V_2$ may be furnished from any suitable power supply and may also be used to power the differential amplifiers.

Figure 2:
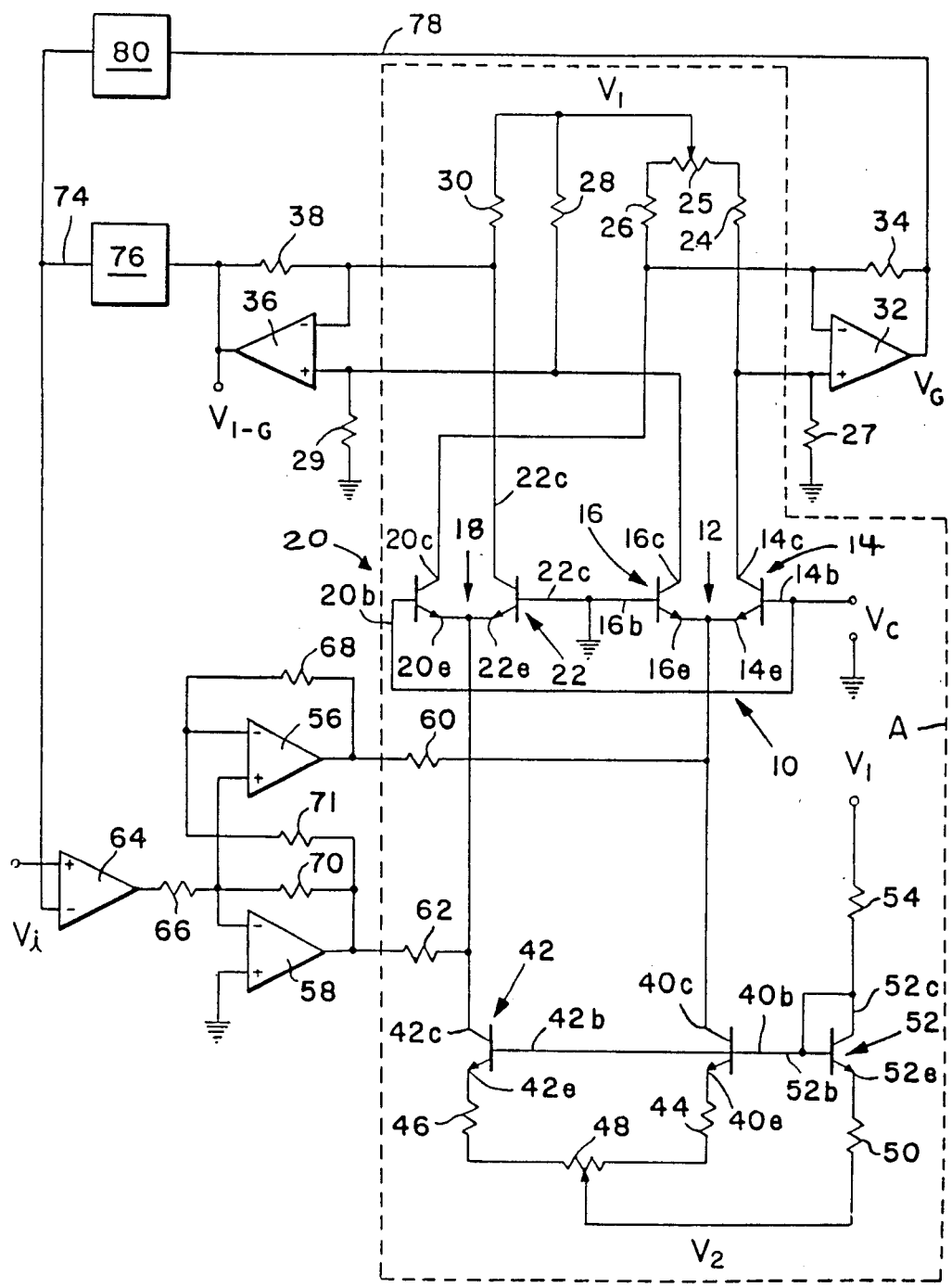
FIG. 2 is a schematic representation of a second circuit embodying the invention, implemented with NPN core transistors.

FIG. 2 shows another embodiment of circuitry manifesting aspects of the invention where the multiplier circuit defined by dash line A is as disclosed in FIG. 1. The circuit of FIG. 2 differs in that line 72 present in FIG. 1 has been eliminated. Substituted for line 72 is a line 78 and a feedback connection 80 providing output of first amplifier 32 for combination with output from second amplifier 36 after these respective output signals have been processed by feedback connections 80, 76. The combined output signal, after processing, is provided as input to the negative input terminal of fifth differential amplifier 64. Feedback connection element 80 may be of the same type as element 76, discussed above.

The circuit of FIG. 2 embodies the advantages described for the circuit of FIG. 1. However, the circuit of FIG. 1 has potential for increased bandwidth over the circuit of FIG. 2. The circuit of FIG. 2 can operate effectively as a voltage controlled potentiometer where the sum of the outputs $V_G$, $V_{1-G}$ is a constant times the input, regardless of control voltage $V_c$.

Figure 3:
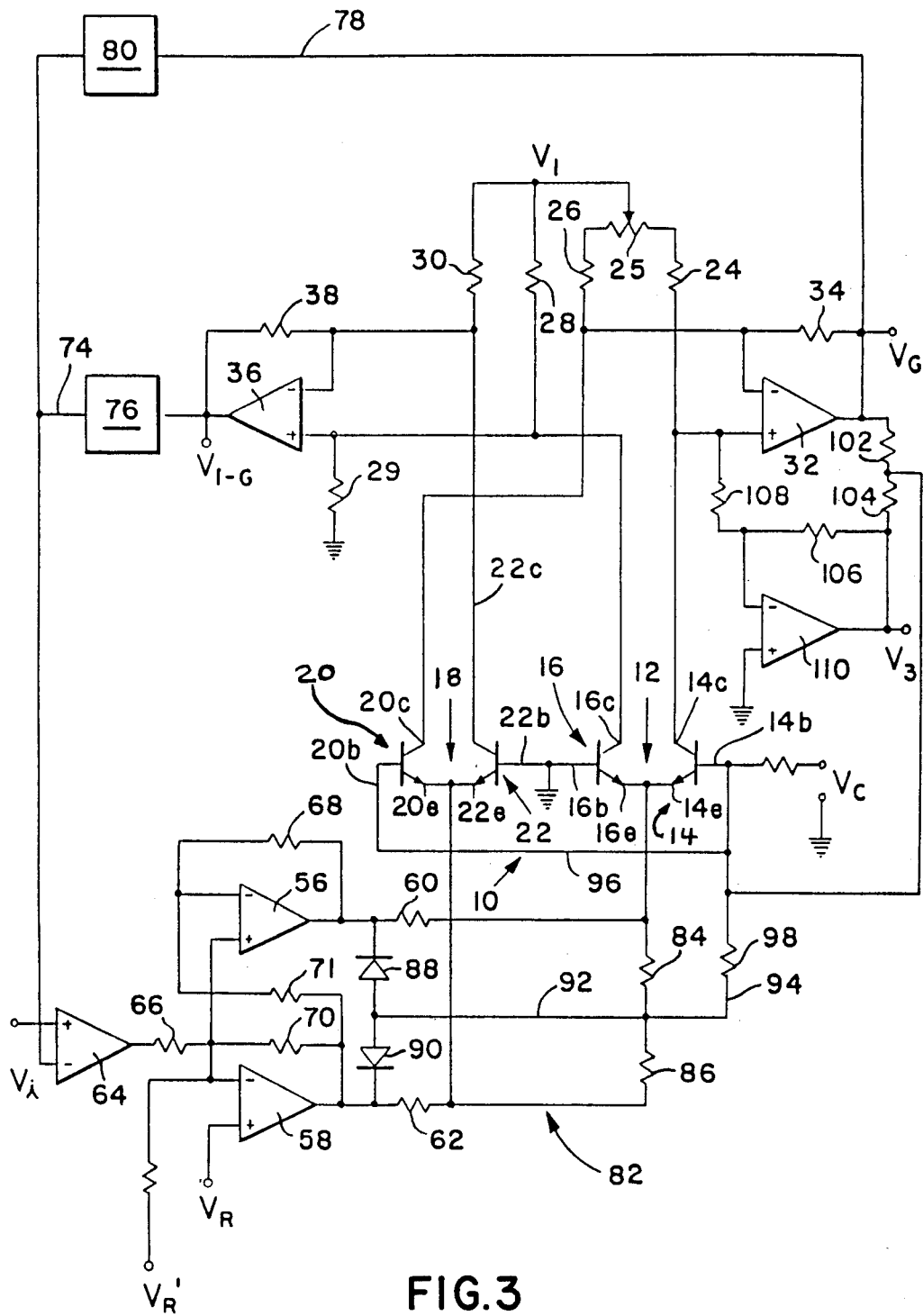
FIG. 3 is a modification of the circuit in FIG. 2.

FIG. 3 illustrates a modification of the circuit of FIG. 2 in which the multiplier circuit is operable in Class AB.

In FIG. 3, the circuit elements are substantially as shown in FIG. 2, with the exception that fifth, sixth and seventh transistors 40, 42, 52 and their associated resistors 44, 46, 48, 50 and 54, have been eliminated and a resistor-diode network denoted generally 82 has been substituted therefor; additionally, two reference voltages $V_R$ and $V_R'$ are supplied as input to third and fourth amplifiers 56, 58. Resistor-diode network 82 includes resistors 84 and 86, and diodes 88 and 90 connecting a bridge line 92 from a point intermediate resistors 84, 86 with outputs of third and fourth amplifiers 56, 58. Network 82 in combination with amplifiers 56, 58 biases the transistors of pairs 12, 18 so that emitter current therefrom is much smaller than in the circuits of FIGS. 1 and 2 but does not go to zero. The resultant Class AB operation permits reduction of equivalent input noise by as much as 15 dB, or more, over the Class A case. Application of reference voltages $V_R$ and $V_R'$ to third and fourth amplifiers 56, 58 causes amplifiers 56, 58 to generate the common mode current required so that the emitter currents from transistor pairs 12, 18 do not reach zero, thereby assuring Class AB operation.

A disadvantage attendant to Class AB operation is that distortion increases due to effects which are not cancelled by negative feedback provided by lines 74, 78. To reduce distortion, the circuit control port defined by connected transistor bases 14b, 20b is modulated by feeding a portion of the common mode current and a portion of the circuit signal output produced at first amplifier 32 to connected bases 14b, 20b.

Control port modulation is achieved by connecting the junction of bridge line 92 intermedate resistors 84, 86 to line 96 connecting bases 14b and 20b via resistor 98. Resistors 106, 108 in combination with sixth differential amplifier 110 produce a voltage $V_3$ at the output of amplifier 110 proportional to the voltage at collector 14c of transistor 14. Voltage $V_3$ is connected via resistor 104 with voltage $V_G$ received via resistor 102; this combined voltage from intermediate resistors 102, 104 is combined with voltage from intermediate resistors 84, 86 as received via resistor 98 and the resultant combination is connected to $V_c$ thereby to produce a correction to control voltage $V_c$ applied to bases 14b, 20b of transistors 14, 20.

When no signal is applied to the circuit of FIG. 3, a small amount of current is still drawn from the connected emitters of each of the respective transistor pairs 12, 18. When a large signal is then applied, this would, but for diodes 88, 90, cause one of pairs 12, 18 to have a greater amount of current drawn through it while the remaining pair would have no current drawn through. The configuration of diodes 88, 90, however, is such that one of the diodes 88, 90 will turn on and pull an extra amount of current through resistors 84, 86, to guarantee that extra current flows, in addition to the signal currents, in both of the respective pairs 12, 18. The additional component of current guarantees that the transistor pair 12 or 18 which might have turned off will not turn off because of the additional current added.

Amplifiers 56 and 58 operate with equal and opposite signal components in them. When no signal is applied, reference voltages $V_R$ and $V_R'$ create a slight negative potential at the output of both amplifier 56 and amplifier 58. With a signal applied, output of amplifier 56, for example, might go slightly above the previous negative potential, while output of amplifier 58 will go slightly below the previous negative potential. In such event amplifier 56 would tend to turn off transistor pair 12 to which amplifier 56 is connected, while amplifier 58 would tend to pull more current from transistor pair 18 to which amplifier 58 is connected. Just before the time when transistor pair 12 connected to amplifier 56 would begin to be starved of current, diode network 82 will turn on with diode 90 operating to permit current flow therethrough thereby to cause current to flow through both resistors 84 and 86, thereby augmenting current flow through both transistor pairs 12 and 18 to assure that current flow through transistor pair 12 connected to amplifier 56 would not go to zero. This defines Class AB operation for the circuit of FIG. 3.

A common mode voltage appearing intermediate resistors 84 and 86 enables effective Class AB operation. The common mode voltage must be summed with another signal—for example, the output of first amplifier 32—to modulate the control port to reduce distortion. In creating control port modulation it is also required to apply a portion of gain G multiplied by the common mode voltage which, in FIG. 3, is voltage at output of amplifier 110. Voltage at the positive terminal of amplifier 32 in FIG. 3 contains a component which is proportional to the common mode voltage and contains a signal output component. At the juncture between resistors 102 and 104, the signal component of that voltage is cancelled so that the circuit combines only the product of the element gain and the common mode voltage; this reduces the distortion. This combining is accomplished by connection of line 100 via resistor 98 with the point intermediate resistors 84, 86, and providing this combination to line 96 connected to the control port where $V_c$ is applied.

Modulating the control port utilizing circuitry illustrated in FIG. 3 results in an order of magnitude improvement in distortion performance. This method may also be used in Class A circuits.

A circuit substantially as disclosed in FIG. 3, when tested, has displayed −97 dBv equivalent input noise at unity gain and −103 dBv equivalent input noise at gain of 20 dB. Distortion at all input and output levels has been less than 0.1%. Control voltage feedthrough has been trimmed to under one millivolt with a 10 KHz control voltage switching sinusoidally between plus and minus 20 dB of gain.

While the circuits of FIGS. 1, 2 and 3 have been illustrated with all NPN transistors in the transistor pairs 12, 18, similar configurations utilizing PNP transistors may be substituted.

Figure 4:
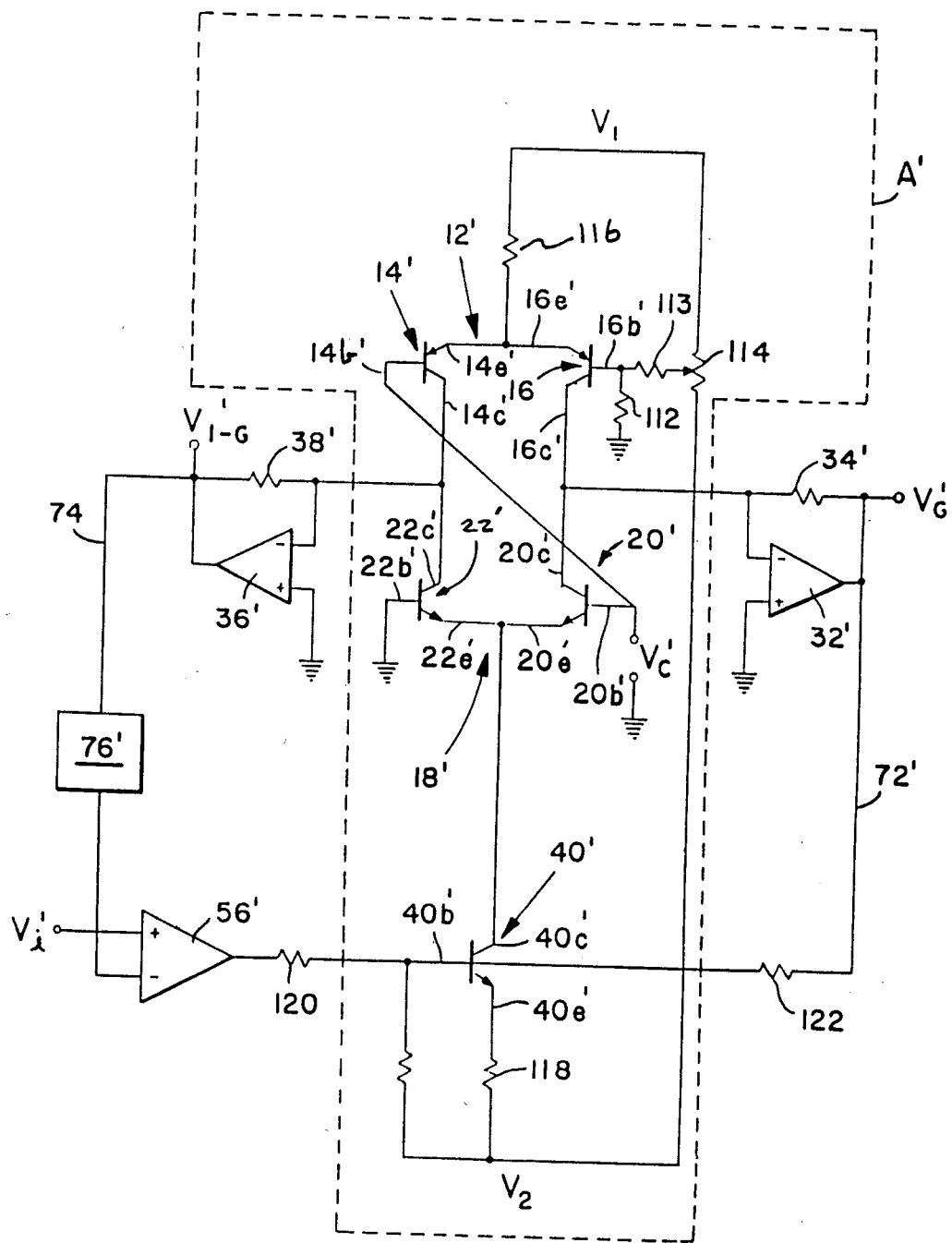
FIG. 4 is a schematic representation of a circuit embodying aspects of the invention implemented with a mixture of NPN and PNP core transistors.
Figure 5:
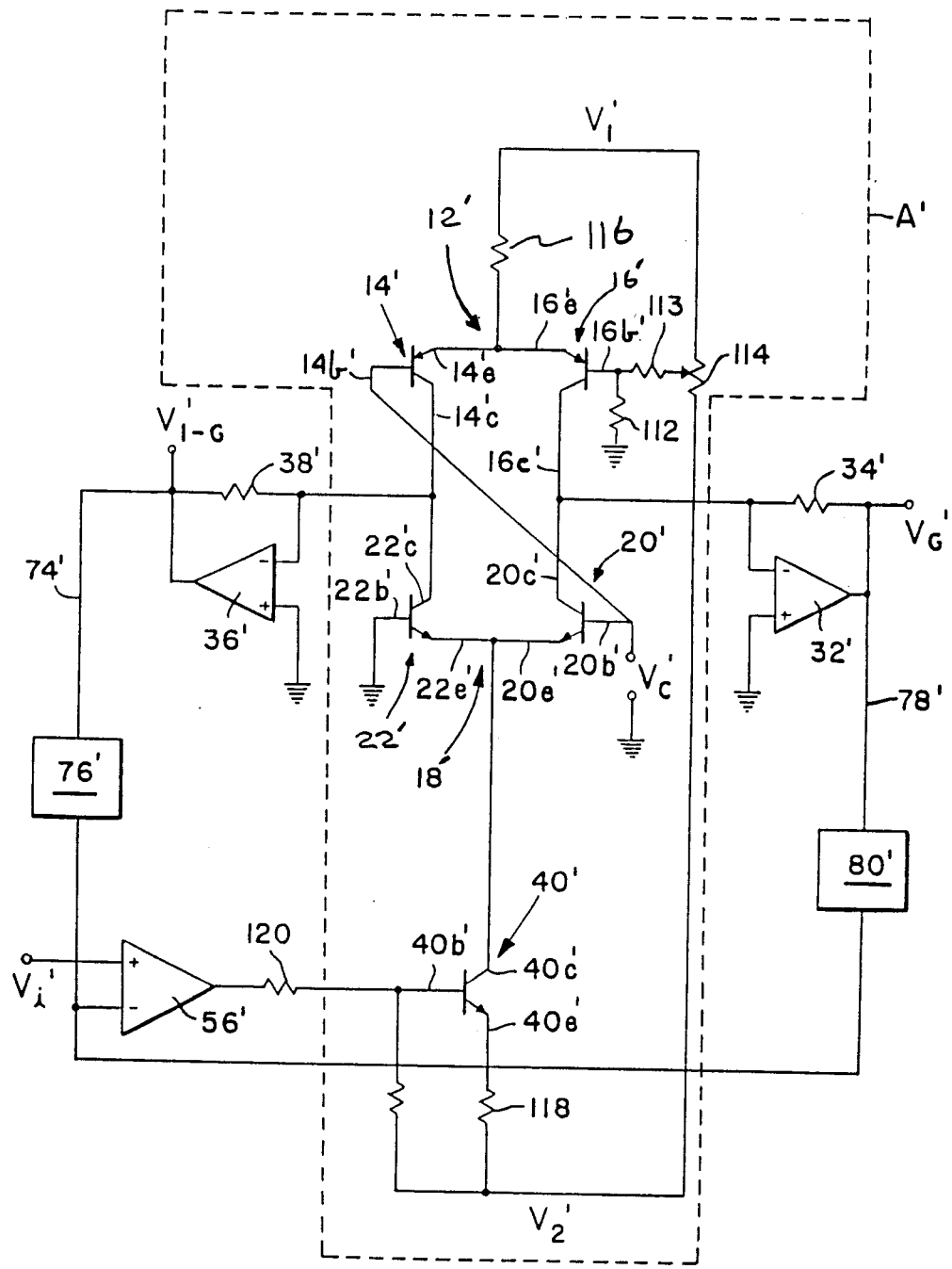
FIG. 5 is a schematic representation of another circuit embodying aspects of the invention implemented with a mixture of NPN and PNP core transistors.

FIG. 4 illustrates schematically a circuit implemented with a mixture of NPN and PNP type transistors. In FIGS. 4 and 5, prime notation denotes elements which are analogous to correspondingly numbered elements, lacking the prime notation, appearing in FIGS. 1, 2 and 3. The first and second pairs of transistors are again designated generally 12' and 18' with first transistor of pair 12' designated generally 14' and second transistor of pair 12' designated generally 16'. Likewise, the first transistor of second pair 18' is designated generaally 20' and the second transistor of second pair 18' is designated generrlly 22'. Respective bases, emitters and collectors of the transistors are denoted by respective letters b, e and c.

Collector 16c' of second transistor 16' of first pair 12' is connected to collector 20c' of first transistor 20' of second pair 18'. Similarly, collector 14c' of first transistor 14' of first pair 12' is connected to collector 22c' of second transistor 22' of second pair 18'. Connected collectors 16c' and 20c' are connected for input to a first amplifier 32'; the signal at the output of first amplifier 32' defines the output voltage $V_G'$ of the circuit element which is proportional to the gain of the circuit element. A resistor 34' provides feedback of the output of amplifier 32' for stabilization thereof. The positive input terminal of amplifier 32' is connected to ground.

The sum of currents from connected collectors 14c', 22c' is provided as a second intermediate output to second differential amplifier 36' which, in combination with feedback resistor 38', converts the second intermediate output from collectors 14c', 22c' to a second output voltage $V_{1-G}'$ proportional to a constant minus G; resistor 38' provides feedback of $V_{1-G}'$ to the negative input terminal of amplifier 36'. The positive input terminal of amplifier 32' is connected to ground. Gain G of the FIG. 4 circuit is the ratio of the emitter current of first transistor 20' to the sum of the emitter currents of first and second transistors 20', 22' defining second pair 18'. The ratio of emitter current of transistor 16' to the sum of the emitter currents for transistors 14', 16' defining first pair 12' is also equal to G.

Base 14b' of first transistor 14' of first pair 12' is connected to base 20b' of first transistor 20' of second pair 18' and these two bases are connected to an input control voltage $V_c'$. This control voltage controls gain of the circuit element. Base 22b' of second transistor 22' of second pair 18' is connected to a ground reference voltage while base 16b' of first transistor 16' of first pair 12' is connected to ground, via a resistor 112, and through resistor 113 to the tap of a variable resistor 114. Ends of variable resistor 114 are connected to respective reference voltages $V_1$, $V_2$.

Emitters 14e', 16e' of transistors 14', 16' of first pair 12' are connected together, as are emitters 20e', 22e' of transistors 20', 22' of second pair 18'. Connected emitters 20e', 20e' are connected to a current source defined by fifth transistor 40'; connection is made to the collector of fifth transistor 40'. Connected emitters 14e' 16e' are connected via resistor 116 to reference voltage $V_1$ Emitter 40e' of fifth transistor 40' is connected to reference voltage $V_2$ via resistor 118.

Fifth transistor 40' operates in response to a signal supplied to the base 40b' thereof from a third differential amplifier 56' via a resistor 120.

A portion of the circuit of FIG. 4 enclosed by dotted line A' is analogous to the portion of the circuit enclosed by dotted line A in FIG. 1 and has operating characteristics analogous thereto.

A line 72' may be provided to feedback output voltage $V_G'$ to base 40b' of fifth transistor 40' via resistor 122. Use of feedback as provided by line 72' produces the same benefits as discussed above with respect to use of line 72 in FIG. 1.

A line 74' may feed back output voltage $V_{1-G}'$ via a feedback connection 76' to third amplifier 56'. Feedback connection 76' may be of the same type as discussed above with respect to connection 76 in FIGS. 1, 2 and 3. Line 74' in combination with feedback connection 76' provides the same benefits as discussed above with respect to line 74 and feedback connection 76 in FIGS. 1, 2, and 3.

FIG. 5 illustrates a circuit configured using a mix of NPN and PNP type transistors. In the circuit of FIG. 5, line 72' has been eliminated and replaced by a line 78' and a feedback connection 80' providing further modification of the input signal to amplifier 56'. Feedback connection 80' may be of the same type as discussed above with respect to connection 80 in FIGS. 2 and 3. $V_G$ is no longer provided directly to the base of fifth transistor 40' but rather is fed back as input to fifth amplifier 56'. This additional feedback path provided by line 78' and feedback connection 80' provides the same benefits as discussed with respect to line 78 and feedback connection 80 in FIGS. 2 and 3.

While the circuit diagrams of FIGS. 1 through 5 disclose use of differential amplifiers and/or transistors and/or resistors as means for drawing respective currents from respective connected emitters, any suitable network of active and/or passive elements could be substituted to provide the means for drawing the respective currents from the respective connected emitters.

Figure 6:
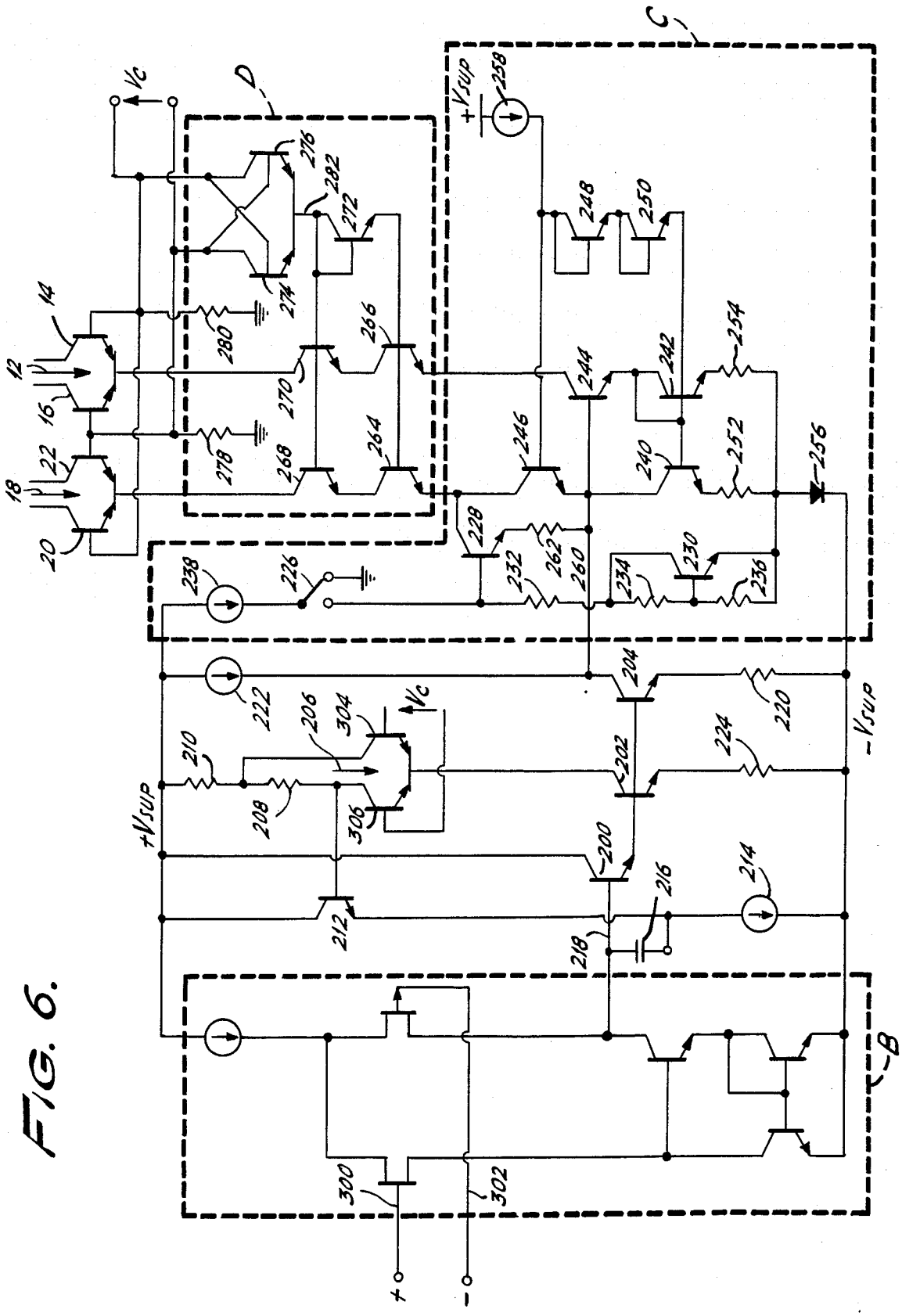
FIG. 6 is a schematic representation of an embodiment of the invention highly suitable for monolithic fabrication, including driver circuitry which has been changed from that shown in FIG. 2.

FIG. 6 shows a preferred driver circuit for the voltage controlled amplifier when the voltage controlled amplifier and driver or support circuit are fabricated monolithically. Referring to FIG. 2, circuitry of FIG. 6 may replace all of the electronics between the plus and minus inputs to amplifier 64 and the connected emitters of transistor pairs 12 and 18. The lines labeled with plus and minus at the left of FIG. 6 correspond directly to the plus and minus inputs to amplifier 64 in FIG. 2.

In addition to replacing the driver circuitry of FIG. 2 as described above, the circuitry of FIG. 6 provides a number of additional features. Specifically, the circuitry of FIG. 6 provides variable compensation, selectable class A or class AB operation, and automatic distortion compensation. In the circuitry of FIG. 6 an input applied between plus and minus terminals 300, 302 is accepted and processed by the circuitry within dotted line B. This circuitry is similar to that of a typical operational amplifier, accepting a differential input voltage and providing a single ended output current. Frequency compensation for the overall circuit may be provided by attaching a capacitor between line 218 and AC ground. Alternately, as is common in operational amplifiers, a capacitor may be placed between line 218 and output of the high gain stage which would be driven by line 218. In the context of the present invention the output of a high gain second stage is generally not available as a voltage because for voltage controlled amplifier applications it is advantageous to process the signal between line 218 and the core transistors 14, 16, 20, 22 in current form.

This problem is overcome with addition of extra circuitry. Transistors 200 and 204 in conjunction with resistor 220 and current source 222 define a high gain second stage with input at the base of transistor 200, provided by line 218, and output at the collector of transistor 204. As in a typical operational amplifier, signal appearing at the output of this second stage, namely at the collector of transistor 204, is suitable for compensating the amplifier. That is, typically a capacitor may be placed between line 218 and the collector of transistor 204 for compensation purposes. However, since the current signal in the collector of transistor 204 is not converted to a voltage, this method of compensation is not suitable.

A simple method for correcting the situation is to create a copy of the signal current in the collector of transistor 204 specifically for the purpose of compensation. Inclusion of transistor 202 and resistor 224, equal in value to the resistor 220, as shown in FIG. 6 creates a similar collector current in the collector of transistor 202 as exists in the collector of transistor 204. Converting this current signal in the collector of transistor 202 to a voltage, for example by connecting a resistor from the collector of 202 to the plus supply rail, would allow a capacitor to be placed between line 218 and the collector of transistor 202 for frequency compensation.

This concept is further enhanced by circuitry shown in FIG. 6. The differential pair of transistors designated generally 206 divides signal current in the collector of transistor 202 into two components whose relative magnitudes depend on control voltage Vc applied between the bases of the transistor differential pair 206.

If the voltage Vc is positive, most of the signal current is directed into the collector of the right hand transistor of pair 206, designated 304 in FIG. 6, dropping the majority of the signal current across only resistor 210. With little current flowing in the other side of differential pair 206 very little signal current flows through resistor 208. Hence voltage at the base of transistor 212 will substantially reflect the voltage drop due to the signal current in the collector of transistor 202 dropping across resistor 210.

If voltage Vc is negative then current will be directed mainly to the opposite side of differential pair 206, to the left hand transistor designated 306 in FIG. 6. This causes voltage at the base of transistor 212 to be due to the signal current flowing in the collector of transistor 202 dropping across both resistors 208 and 210. If resistor 208 is significantly larger than resistor 210 in value, then a large change in the signal voltage appearing at the base of transistor 212 occurs due to changing voltages between the bases of the transistors 304, 306 in differential pair 206.

Transistor 212 and current source 214 define an emitter follower amplifier; the voltage at the emitter of transistor 212 is substantially equal to that at its base. Connecting the capacitor 216 as shown, between line 218 and the emitter of transistor 212 provides frequency compensation. The amount of compensation achieved depends directly upon the signal voltage appearing at the base of transistor 212 and hence at the emitter of transistor 212. This is due to the well-known Miller effect. Since voltage appearing at the emitter of transistor 212 depends on the control voltage Vc, the amount of compensation is variable and depends upon control voltage Vc.

The variable compensation described above is particularly desirable for use in voltage controlled amplifier applications. Considering, for example, the embodiment of FIG. 2, where feedback network 76 is active and feedback network 80 is omitted, the advantage of using variable compensation can be illustrated. Overall performance of a negative feedback amplifier is determined by its loop gain. At any frequency, the loop gain of the amplifier in FIG. 2 is a function of the current splitting ratio in the core transistors of the differential pairs 12, 18. As gain of the device is varied by varying the control voltage Vc, loop gain is also varied. As a result performance of the amplifier in an overall sense changes as the control voltage is changed. For certain settings of the control voltage, performance can be heavily degraded due to the frequency compensation required to stabilize the system in its worse case. It is desirable, therefore, to vary frequency compensation as control voltage is varied, to partially offset the difficulty arising from varying loop gain. Controlling the bases of transistor pair 206 from the same control voltage as applied to the core transistors of the voltage controlled amplifier achieves the desired effect. Namely, loop gain is stabilized with varying control voltage by varying frequency compensation. This results in an order of magnitude improvement or more in the loop characteristics of the voltage controlled amplifier over that achieved using fixed compensation.

In FIG. 6 the circuitry following the second stage described above is driven from the collector of transistor 204 and creates a differential drive signal compatible with the core transistors of the differential pairs 12, 18 from the single ended signal supplied at the collector of transistor 204. This circuitry is within dotted line C. This drive circuitry provides a class A or class AB drive circuit. Position of switch 226 determines whether the circuitry operates in class A or class AB.

With switch 226 in the position shown in FIG. 6 the drive circuitry operates in class AB. With switch 226 in this position, transistors 228 and 230 along with associated resistors 232, 262, 234 and 236 are effectively inoperative and may be ignored. The circuit then functions through operation of transistors 246, 244, 240 and 242 and resistors 252 and 254. Diode 256 prevents the collector of transistor 204 from saturating but does not otherwise effect circuit operation. Transistors 246 and 244 are nominally biased under no signal conditions through current source 258 and transistors 248 and 250. With typical close matching between components on an integrated circuit, current flowing in transistors 248 and 250 is the same as current flowing in the base-emitter junctions of transistors 246 and 244. This current is equal to current generated in current source 258. As a result, current source 258 can be varied to adjust standing quiescent current to any desired value.

Under signal conditions the operation of the circuit is as follows: When signal in the collector transistor 204 increases, current supplied by the emitter of transistor 246 flows from right to left on line 260 in FIG. 6. Current in transistor 244 is essentially unaffected. Signal current, in this direction, causes only a change in the collector of transistor 246. When the signal in collector transistor 204 decreases, current flows from left to right in line 260 in FIG. 6, activating the current mirror defined by transistors 244, 240, 242 and resistors 252 and 254. With resistors 252 and 254 chosen of equal value, operation of this circuit is similar to the standard Wilson current mirror used in integrated circuit technology. Current of equal and opposite value flows in the collector of transistor 244. Virtually no current change from nominal occurs in the collector of transistor 246. Hence, for this signal input polarity, the collector of transistor 244 carries the signal component. Since current in the collectors of transistors 244 and 246 does not go to zero but alternates in carrying positive and negative phases of applied input signal, this is a class AB driver for the core transistors.

Class A operation for this driver circuit is achieved by moving switch 226 to the other position, away from the ground position shown in FIG. 6. This causes current source 238 to be diverted toward resistor 232 and towards the $V_{be}$ (base-emitter voltage) multiplier consisting of resistors 234 and 236 and transistor 230. Resistor 234 is preferably chosen to be twice as large as resistor 236, to provide a three diode drop between the collector of transistor 230 and its emitter. The value of resistor 232 and current source 238 is chosen to establish a voltage drop of approximately one volt across resistor 232. These series voltage drops bias the base of transistor 228 approximately three diode drops plus one volt above the anode of diode 256. This activates transistor 228 and causes current to flow in resistor 262. If resistor 262 is equal in value to resistors 252 and 254, then approximately one half volt develops across resistor 262 and one half volt cross resistors 252 and 254. By choosing the absolute values of these three resistors in such a way that one half volt across them causes the necessary DC quiescent current for class A operation, a class A driver results: current in resistor 254 equals current in transistor 244 and the diode-connected transistors 248 and 250 hold a fixed potential between the base of transistor 246 and the emitter of transistor 244. The increase in current in transistor 244 causes an increase in this base-to-emitter voltage which in turn causes a decrease in the base-to-emitter voltage of transistor 246, substantially turning off transistor 246 for this mode of operation. As a result, transistor 228 is the active driver transistor for the left hand pair 18 of the core transistors. Since transistor 228 carries current flowing in resistor 262, the left part of the core—i.e., transistors 20 and 22 in FIG. 6—is biased with the same current as the right part of the core—i.e transistors 14 and 16 in FIG. 6—since the current in resistor 262 equals that in resistor 254.

Class A operation is achieved through the interaction of resistors 262, 252, 254 and the fixed bias between the base of transistor 228 and the anode of diode 256. An increase in signal current in the collector of transistor 204 causes an increase in the current through resistor 262. This increases the voltage across resistor 262 and hence decreases voltage across resistors 252 and 254, due to the fixed bias between the base of transistor 228 and the anode of diode 256. Since voltage across resistor 254 drops, current in resistor 254 drops and hence current in transistor 244 drops. Hence, drive to the left side of the core transistors 20 and 22 is increased by approximately the same amount as drive to the right side of the core transistors 14, 16 is decreased. An equal but opposite effect is caused by a decrease in current in the collector of transistor 204. This is characteristic of class A operation and hence the drive circuitry within dotted line C selectably functions as a class A or a class AB driver.

The two output currents from the driver are directly compatible with the core transistors of the voltage controlled amplifier. For class A operation the circuit performs quite well and the drive currents can be applied directly to the core transistors. For class AB operation, however, a distortion component is produced, as discussed above.

Circuitry consisting of transistors 264, 266, 268, 270, 272, 274, 276 and resistors 278 and 280, within dotted line D in FIG. 6, compensates for distortion produced by class AB operation. In addition this circuitry tends to compensate for distortion produced during class A operation, although this distortion is generally less objectionable.

Current in the emitters of transistors 264 and 266 is almost completely transferred to their respective collectors, which causes current flow in the emitters of transistors 268 and 270 respectively. Those emitter currents are transferred to the collectors of transistors 268 and 270 and hence tail currents for differential pairs 18 and 12 respectively. Hence, inclusion of transistors 264 through 270 in FIG. 6 causes virtually no change in the current actually applied to the core transistors 14, 16, 20, 22.

Samples of the core driver currents are provided at the bases of the four transistors mentioned (264, 266, 268, 270). For example, current at the base of transistor 264 is approximately equal to the emitter current divided by the current gain of the transistor. Current in line 282 is two times current flowing in transistor 264 divided by its current gain plus two times current in transistor 266 divided by its current gain, due to addition of all four base currents. (Transistor 272 is included only to prevent transistors 264 and 266 from saturating.)

The current in line 282 is exactly that required to compensate for distortion produced by class AB operation. This is performed in much the same way as discussion above by modulating control voltage to the core transistors 14, 16, 20, 22. The exact modulation required to cancel the distortion is provided through operation of transistors 274 and 276 which route varying proportions of current in line 282 to either pair of connected bases of the core transistors. By making the Thevenin equivalent resistance (designated by resistors 278 and 280 in FIG. 6) from the bases of the core transistors to ground an appropriate value, distortion is effectively cancelled. The value of resistors 278 and 280 is determined both by the characteristics of the core transistors and by the current gain of transistors 264 through 270.

Since current gain of transistors is matched to within approximately ten percent on an integrated circuit, a fair degree of predictability can be achieved through use of this compensation scheme. Furthermore, more pairs of transistors, such as transistors 264 and 266, may be cascaded to produce larger current in line 282. This provides greater accuracy, minimizing the effect of statistical variations in the current gains of the transistors, and allows resistance represented by resistors 278 and 280 to be reduced. This is desirable since the value of resistors 278 and 280 affects noise generated in the core transistors.

I claim the following:

1. A monolithically fabricated voltage controlled element comprising:
   a. first and second pairs of transistors, each of said transistors having a base, an emitter and a collector;
   b. second transistors of each pair having their bases connected together;
   c. first transistors of each pair having their bases connected together;
   a control voltage being applied between said connected pairs of bases;
   d. emitters of said transistors of said respective pairs being connected together, respective paired emitters being connected to switchable means for drawing current therefrom, operating in response to an input current signal;
   e. said switchable current drawing means drawing respective currents from said respective emitters, the difference of which corresponds accurately to said input current signal, and including:
      (i) means for drawing current from said respective emitters in a manner that the sum of the respective drawn currents is a first constant for any value of said input current signal below a predetermined maximum;
      (ii) means for drawing current from said respective emitters in a manner that the sum of the respective drawn currents is a second contant whenever said input current signal is below a predetermined value less than said predetermined maximum; and
      (iii) means for alternately selectably actuating (1) said means for drawing current from said respective emitters in a manner that the sum of the respective drawn currents is a first constant for any value of said input current signal below a predetermined maximum and (2) said means for drawing current from said respective emitters in a manner that the sum of the respective drawn currents is a second constant whenever said input current signal is below a predetermined value less than said predetermined maximum.

2. The element of claim 1 further comprising means for reducing distortion produced by said first and second pairs of transistors by sampling the sum of the respective currents drawn from said connected pairs of emitters and thereafter adding to said control voltage a signal which is proportional to said sampled sum and is also a function of said control voltage.

3. The element of claim 1 wherein said means for drawing respective currents from said respective emitters further comprises:
   a. means for directly coupling said input signal current to a first output in phase with said input current signal;
   b. means for mirroring said input current to a second output out of phase with said input current signal; wherein said first and second outputs constitute said respective currents from said respective emitters, and
   c. means for selectably altering behavior of at least one of said direct coupling and mirroring means for effecting substantially class A or AB operation.

4. The element of claim 1 further comprising means for frequency compensating said element to avoid oscillation at high frequencies by converting input voltage provided to said element to said input current signal and reducing input voltage conversion gain responsively thereto.

5. The element of claim 4 further comprising means for reducing distortion produced by said first and second pairs of transistors by sampling the sum of respective currents drawn from said connected pairs of emitters and adding to said control voltage a signal which is proportional to said sampled sum and is also a function of said control voltage.

6. The element of claim 5 wherein said distortion reducing means is interposed between said first and second pairs of transistors and said current drawing means and further comprises:
   a. pairs of cascode connected transistors with first transistors and second transistors of each cascode connected pair having their respective bases connected together;
   b. means for combining signals from the respective connected bases of said cascode connected pairs thereby producing a sample of said sum of the respective currents drawn from said connected pairs of emitters of said first and second pairs of transistors; and
   c. a differential pair of transistors receiving said sample as tail current and receiving said control voltage between respective bases thereof, output current from said collectors of said differential pair being provided to said connected bases of said first and second pairs of transistors.

7. The element of claim 6 wherein said means for drawing respective currents from said respective emitters further comprises:
   a. means for directly coupling said input signal current to a first output in phase with said input signal current;

b. means for mirroring said input current to a second output out of phase with said input signal current; wherein said first and second outputs constitute said respective currents from respective emitters and c. means for selectably altering behavior of at least one of said direct coupling and mirroring means for effecting class A or AB operation.

8. The element of claim 1 wherein said means for drawing respective currents from said respective emitters further comprises:

a. means for directly coupling said input current signal to a first output in phase with said input current signal;

b. means for mirroring said input current to a second output out of phase with said input current signal; wherein said first and second outputs constitute said respective currents from respective emitters and wherein said direct coupling means further comprises:

c. alternate signal path means for effecting substantially class A or AB operation.

9. The element of claim 8 wherein said switchable means further comprise means for establishing fixed bias currents in said direct coupling and mirroring means thereby establishing equal quiescent currents in each of said first and second outputs whenever said input current signal is zero.

10. The element of claim 9 wherein said switchable means further comprise alternate means corresponding to said alternate signal paths for establishing fixed bias currents in said direct coupling and mirroring means thereby establishing equal quiescent currents in each of said first and second outputs whenever said input current signal is zero.

11. The element of claim 10 wherein said alternate means further comprise means for actuating only one of said alternate signal paths thereby causing a selected one of said alternate signal paths to take precedence over remaining alternate signal paths.

12. The element of claim 11 wherein one of said alternate signal paths for establishing fixed bias current in said direct coupling means further comprises respective common base amplifiers and wherein one of said alternate signal paths for establishing fixed bias current in said mirroring means comprises at least two transistors connected as a standard current mirror.

13. A monolithically fabricated voltage controlled element comprising:

a. first and second pairs of transistors, each of said transistors having a base, an emitter and a collector;

b. second transistors of each pair having their bases connected together;

c. first transistors of each pair having their bases connected together;

a control voltage being applied between said connected pairs of bases;

d. emitters of said transistors of said respective pairs being connected together, respective paired emitters being connected to means for drawing current therefrom in response to an input current signal; and e. means for reducing distortion produced by said first and second pairs of transistors by sampling the sum of respective currents drawn from said connected pairs of emitters and adding to said control voltage a signal which is proportional to said sampled sum and is also a function of said control voltage.

14. The element of claim 13 wherein said distortion reducing means is interposed between said first and second pairs of transistors and said current drawing means.

15. The element of claim 14 wherein said distortion reducing means further comprises:

a. pairs of cascode connected transistors with first transistors and second transistors of each cascode connected pair having their respective bases connected together;

b. means for combining signals from respective connected bases of said cascode connecting pairs thereby producing a sample of said sum of the respective currents drawn from said connected pairs of emitters of said first and second pairs of transistors; and c. a differential pair of transistors receiving said sample as tail current and receiving said control voltage between respective bases thereof, output current from said collectors of said differential pair being provided to said connected bases of said first and second pairs of transistors.

16. A monolithically fabricated voltage controlled element comprising:

a. first and second pairs of transistors, each of said transistors having a base, an emitter and a collector;

b. second transistors of each pair having their bases connected together;

c. first transistors of each pair having their bases connected together;

a control voltage being applied between said connected pairs of bases;

d. emitters of said transistors of said respective pairs being connected together, respective paired emitters being connected to means for drawing current therefrom in response to an input current signal; and e. means for frequency compensating said element to avoid oscillation at high frequencies by converting input voltage provided to said element to said input current signal and reducing input voltage conversion gain responsively thereto.

17. The element of claim 16 further comprising means for reducing distortion produced by said first and second pairs of transistors by sampling the sum of respective currents drawn from said connected pairs of emitters and adding to said control voltage a signal which is proportional to said sampled sum and is also a function of said control voltage.

18. The element of claim 16 wherein said frequency compensating means further comprises:

a. means for generating a substantial duplicate of current generated by said input voltage converting means; and b. means for reducing gain of said voltage converting means responsively to said duplicate current.

19. The element of claim 18 further comprising means for scaling the gain of said voltage converting means responsively to said control voltage applied between said connected pairs of bases.

20. The element of claim 19 wherein said means for converting input voltage, provided to said element, to said input current signal includes a transconductance amplifier and a current amplifier receiving input from said transconductance amplifier, said current amplifier including an output transistor; wherein said means for generating a substantial duplicate of current generated by said input voltage converting means includes an output transistor in parallel connection with said output transistor of said voltage converting means.

* * * * *